(12) United States Patent
Clevenger et al.

(10) Patent No.: US 6,399,447 B1
(45) Date of Patent: Jun. 4, 2002

(54) METHOD OF PRODUCING DYNAMIC RANDOM ACCESS MEMORY (DRAM) CELL WITH FOLDED BITLINE VERTICAL TRANSISTOR

(75) Inventors: Lawrence A. Clevenger, LaGrangeville; Louis Lu-Chen Hsu, Fishkill; Jack A. Mandelman, Stormville; Carl J. Radens, LaGrangeville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/619,671

(22) Filed: Jul. 19, 2000

(51) Int. Cl.[7] ............ H01L 21/336; H01L 21/8242
(52) U.S. Cl. ............... 438/268; 438/238; 438/243; 438/270; 438/272
(58) Field of Search .................. 438/238, 243, 438/386, 268, 173, 192, 206, 209, 212, 270, 272

(56) References Cited

U.S. PATENT DOCUMENTS

| | | | | |
|---|---|---|---|---|
| 5,214,603 A | * | 5/1993 | Dhong et al. | 365/207 |
| 5,831,301 A | * | 11/1998 | Horak et al. | 257/302 |
| 5,914,511 A | * | 6/1999 | Noble et al. | 257/302 |
| 6,074,909 A | * | 6/2000 | Gruening | 438/242 |
| 6,175,128 B1 | * | 1/2001 | Hakey et al. | 257/296 |
| 6,184,549 B1 | * | 2/2001 | Furukawa et al. | 257/302 |
| 6,218,696 B1 | * | 4/2001 | Radius | 257/302 |
| 6,271,081 B2 | * | 8/2001 | Kajiyama | 438/243 |

OTHER PUBLICATIONS

Gruening et al., "A Novel Trench DRAM Cell with a VERtIcal Access Transistor and BuriEd STrap (VERI BEST) for 4Gb/16Gb", International Electron Devices Meeting (IEDM), Dec. 5–8, 1999, pp. 25–28.*

Itabashi et al., "A Split Wordline Cell for 16Mb SRAM Using Polysilicon Sidewall Contacts", IEDM, Dec. 8–11, 1991, pp. 477–480.*

* cited by examiner

Primary Examiner—Matthew Smith
Assistant Examiner—Lex H. Malsawma
(74) Attorney, Agent, or Firm—Marian Underweiser, Esq.; McGinn & Gibb, PLLC

(57) ABSTRACT

A semiconductor device and a method for forming the semiconductor device, include forming a mandrel, forming spacer wordline conductors on sidewalls of the mandrel, separating, by using a trim mask, adjacent spacer wordline conductors, and providing a contact area to contact alternating ones of pairs of the spacer wordline conductors.

18 Claims, 15 Drawing Sheets

US 6,399,447 B1

METHOD OF PRODUCING DYNAMIC RANDOM ACCESS MEMORY (DRAM) CELL WITH FOLDED BITLINE VERTICAL TRANSISTOR

CROSS-REFERENCE TO RELATED APPLICATION

The present application is related to U.S. patent application Ser. No. 09/619,664, filed concurrently herewith, to Clevenger et al., entitled "SELF-TRIMMING METHOD ON LOOPED PATTERNS" having IBM Docket No. YO999-515, assigned to the present assignee, and incorporated herein by reference.

BACKGROUND OF THE INVENTION

1. Field of the Invention

The present invention generally relates to a dynamic random access memory (DRAM) cell, and more particularly to a DRAM cell with a folded bitline vertical transistor.

2. Description of the Related Art

Some conventional DRAM memory systems utilize folded bitline sensing. Such conventional folded bitline architectures permit the rejection of common-mode noise components between adjacent cells in the array, and across the array. Array cells with an area $>8F^2$ (e.g., F is equal to one minimum feature size) typically use an active wordline and a passing wordline (2F+2F=4F pitch) across each cell to obtain folded bit sensing with a single level of wiring for the bitline.

However, there are some problems of the conventional architecture when applied to an open-bitline array cell with area $<8F^2$. For example, common-mode array noise rejection of open-bitline sub-$8F^2$ DRAM cell arrays is reduced relative to the conventional folded $8F^2$ DRAM cell.

An additional bitline wiring level may be added to provide a vertical folding (e.g., see Hoernigschmid et al., IEEE Journal of Solid State Circuits, Vol. 35, No. 5, May 2000, page 713), but there is an increased cost and complexity of the additional bitline wiring level (for vertical global folding) in the sub-$8F^2$ DRAM.

Additionally, the vertical folding as described in Hoernigschmid et al., IEEE Journal of Solid State Circuits, Vol. 35, No. 5, May 2000, page 713), will only provide common mode rejection of noise components which are introduced on the spatial scale of the vertical folding bitline interchange interval over the array. Noise components which are introduced on a spatial scale of less than the bitline interchange interval in the array will not be rejected by the sense amplifiers, and will degrade product operation margins.

SUMMARY OF THE INVENTION

In view of the foregoing and other problems of the conventional architecture, it is an object of the present invention to provide a structure (and method for producing the structure) for providing a small (e.g., sub-$6F^2$) DRAM cell with a folded bitline vertical transistor which overcomes the above-mentioned problems of the conventional architecture.

Another object is to provide a DRAM cell with a half-pitch wordline and vertical device array access transistor.

In a first aspect of the present invention, a method (and semiconductor device formed thereby) of forming a semiconductor device, includes forming a mandrel, forming spacer wordline conductors on sidewalls of the mandrel, separating, by using a trim mask, adjacent spacer wordline conductors, and providing a contact area to contact alternating ones of pairs of the spacer wordline conductors.

With the unique and unobvious aspects and features of the invention, a half-pitch wordline is provided which achieves locally-folded sensing, and common-mode rejection of noise components introduced on the scale of adjacent cells, and on the scale of the array.

Additionally, a half-pitch wordline eliminates the need for an additional bitline wiring level.

Further, with the invention, a vertical array cell access transistor channel length may be scaled independently of the lithographic ground rule.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF PREFERRED EMBODIMENTS OF THE INVENTION

Figure 1:
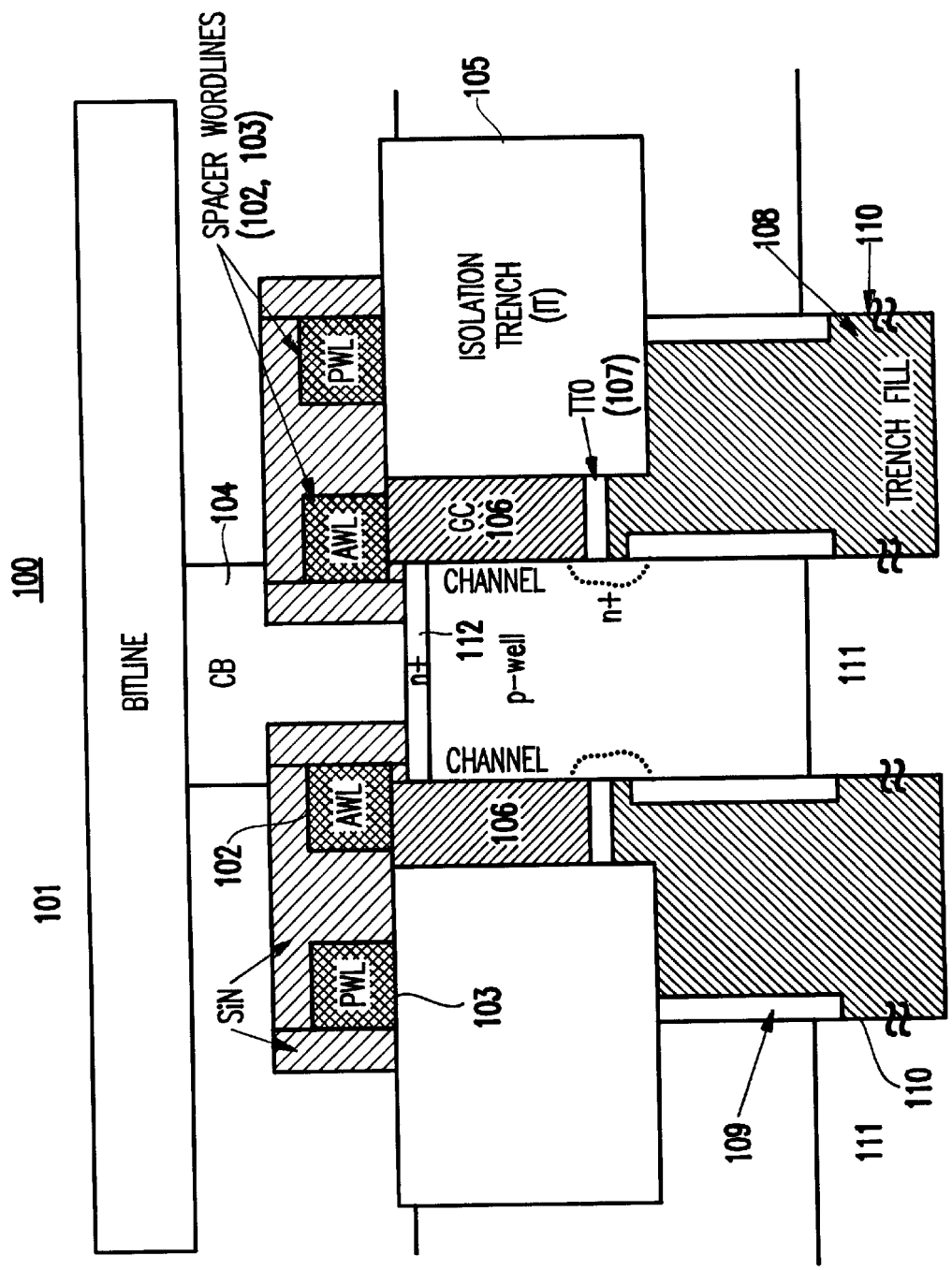
FIG. 1 is a schematic diagram of a completed structure according to a first preferred embodiment of the present invention.

Referring now to the drawings, and more particularly to FIGS. 1–18, there are shown preferred embodiments of the method and structures according to the present invention.

Generally, the invention provides a solution to the above-mentioned problems of the conventional architecture by providing a DRAM cell utilizing folded bitline sensing with a half-pitch wordline and a vertical device array access transistor.

The half-pitch wordline provides locally-folded sensing, and common-mode rejection of noise components introduced on the scale of adjacent cells, and on the scale of the array. The half-pitch wordline eliminates the need for an additional bitline wiring level(s). Additionally, a vertical array cell access transistor channel length may be scaled independently of the lithographic ground rule.

First Embodiment

A first embodiment of the invention of a method and structure for a half-pitch wordline with a vertical array access transistor is shown in FIGS. 1–7.

That is, a completed structure 100 is shown in the cross-sectional view of FIG. 1. That is, FIG. 1 shows a cross-section of the inventive structure, with the cross-section being made through a bitline 101.

The structure of the invention includes a half-pitch active wordline (AWL) 102 and a passing wordline (PWL) 103, a borderless array diffusion contact (CB) 104, an isolation trench (IT) 105, a gate conductor (GC) 106, and a trench top-oxide (TTO) 107. Further shown in FIG. 1 are two adjacent storage trenches (capacitors) 108, oxide collars 109, node dielectric 110, N+plates 111, two adjacent vertical metal oxide semiconductor field effect transistors (MOSFETs) formed on the sidewalls of the two adjacent storage trenches 108 (e.g., labeled "channel"), and the common bitline diffusion 112 (e.g., N+), In FIG. 1, wordlines are formed by a non-lithographic conductive spacer technique, thus allowing the pitch of the wordline conductors to be halved. That is, the wordlines can be provided on a sub-minimum feature pitch. The denser pitch provided by the present invention allows both the passing wordline (PWL) 103 and the active (AWL) wordline 102 to be formed in the same area that would normally contain a single wordline formed using conventional lithographic techniques.

Thus, for the same cell layout that is normally constrained to use an open bitline architecture (with a single metal wiring), a folded bitline operation is achieved. A folded bitline architecture is preferred in the art because of its immunity to common mode noise, thus allowing the reliable sensing of weaker signals.

Figure 2:
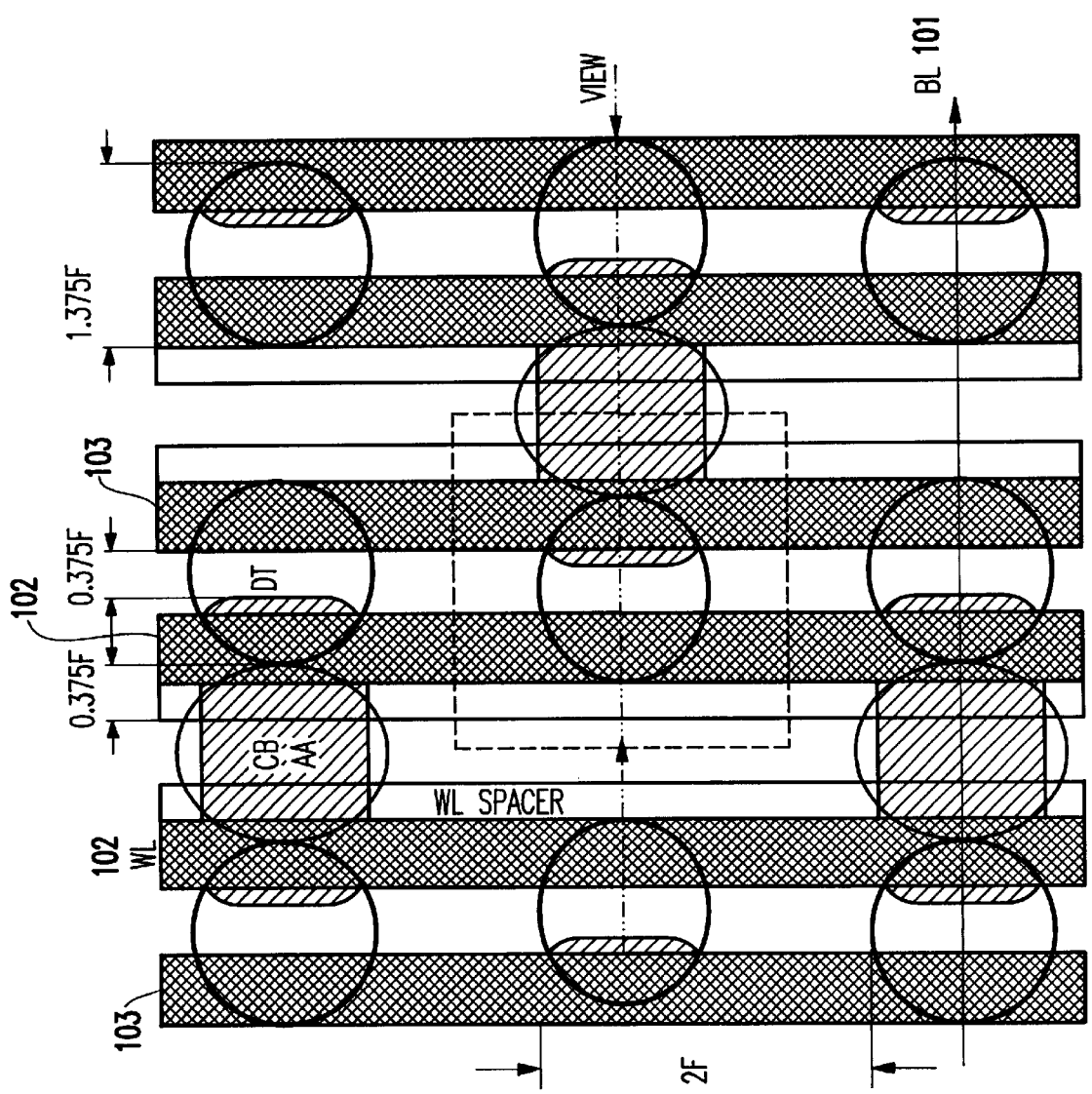
FIG. 2 illustrates an exemplary cell array layout including an overlay tolerance of the bit contact using the structure of FIG. 1 according to the present invention.

FIG. 2 shows the top view of a preferred layout embodiment of a DRAM array using spacer wordlines with vertical access transistors in the folded bitline arrangement of the present invention.

In FIGS. 1 and 2, the bitlines (BL) 101 extend in the horizontal direction and the spacer wordlines (crosshatched) 102, 103 extend vertically (e.g., as better shown in FIG. 2). For a given bitline conductor, pairs of active wordlines 102 share a single bitline contact (CB) 104. Pairs of active wordlines 102 alternate with pairs of passing wordlines 103 on a given bitline conductor. Thus, when an addressed wordline goes high, cells on alternating bitlines are selected. Thus, all mating bitlines (BL) 101 are active at any one time, thereby resulting in the folded bitline architecture with a single level of bitline metallurgy.

As shown in FIG. 2, with the invention, a cell layout of $5F^2$ is shown which is equal to a 2F isolation pitch by a 2.5 F wordline pitch (e.g., 2F×2.5F). This allows the invention to be approximately 1.6 times as dense as the $8F^2$ foled-bitline cell possible with lithographic processes/techniques. Typically, in lithographic techniques, for example, a conductor takes up a minimum of one feature (F) size and the minimum space between conductors is one feature size. Thus, going from one point on one conductor to the same point on another, adjacent conductor line is 2F.

However, the present invention uses a folded bitline arrangement which allows a pitch of 1F between one gate conductor to a same point of another, adjacent conductor. Hence, the invention allows a much denser wordline wiring arrangement (e.g., twice that possible with lithographic processes) while minimizing noise induced on the bitline conductor.

Figure 3:
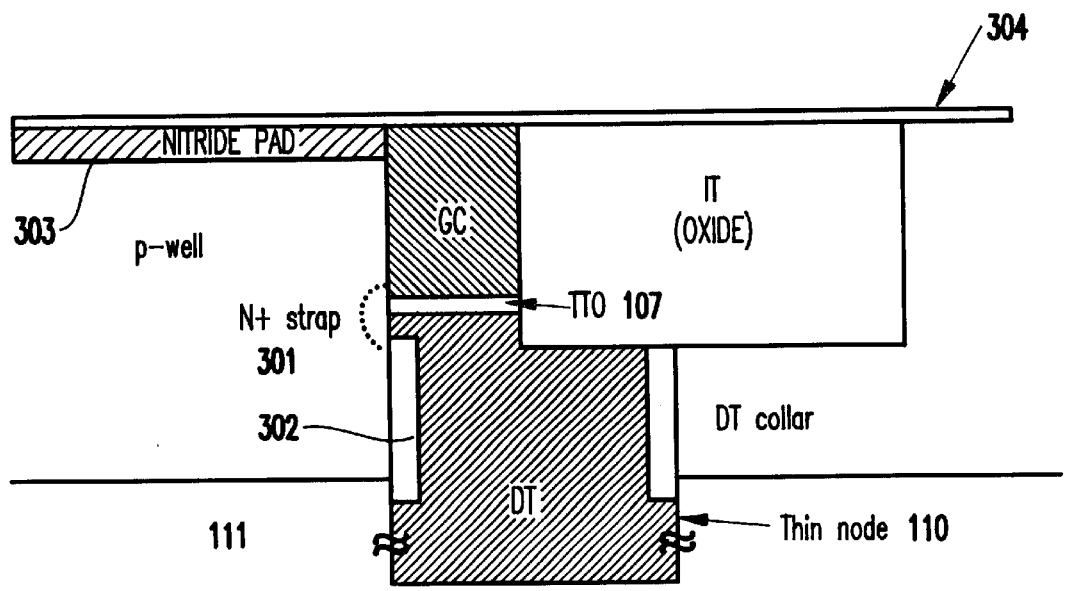
FIG. 3 illustrates a starting point for the fabrication of the structure according to the present invention, and more specifically illustrates a conventional DRAM trench capacitor 108, buried strap 301, and isolation trench (IT) 105 in which the top layer of the isolation trench has been planarized.

Turning now to the method of forming the structure of the first embodiment for a half-pitch wordline with a vertical array access transistor, FIG. 3 illustrates a first step of the first preferred embodiment of the inventive method for fabricating the spacer-wordline vertical MOSFET cell with folded bitlines.

In FIG. 3, an initial silicon substrate is processed through the formation of the deep trench storage capacitors (DT) and isolation trench (IT), as is known to those with ordinary skill in the art.

The steps to realize the structure in FIG. 3 include forming pad layers on a standard p-type monocrystalline silicon substrate. Thereafter, anisotropic (directional) etching (RIE) is performed to form deep trenches for deep trench storage capacitors, and then the capacitors are formed within each deep trench. An N+plate is formed in the substrate to serve as one electrode of the capacitor, a thin node dielectric 110 and isolation collar 109 are formed along the sidewall of the trench capacitor 108.

Then, an inner conductor (e.g., which will form the other electrode of the capacitor), formed of N+polysilicon conductor, is formed in the deep trench. The polysilicon is recessed to a predetermined distance below the top silicon surface, and a TTO (trench top oxide) 107 is formed over the storage node N+polysilicon conductor. Thereafter, a gate oxide is formed on the trench sidewall above the TTO 107.

Thereafter, in the upper portion of the deep trench (which is unfilled up to now) is formed the transistor which includes an N+strap 301, a gate insulator 302, and the gate conductor 106. That is, deposition and polishing of the gate conductor polysilicon (GC) 106 occurs such that it is flush with the top surface of a nitride pad layer 303. Then, the isolation trench 105 is formed.

Thereafter, a masking pattern is formed and the isolation trenches (IT) 105 are etched. The isolation trenches 105 are filled with a CVD oxide (i.e., TEOS or HDP oxide) and planarized to the top surface of a nitride pad layer 303.

A thin (e.g., 5–20 nm) CVD nitride layer 304 is deposited over the planarized surface. This thin SiN layer 304 will serve as an etch stop during the subsequent etching of an oxide mandrel layer, described below.

As mentioned above, the structure of FIG. 3 is believed to be conventional and well-known to those in the art.

Figure 4:
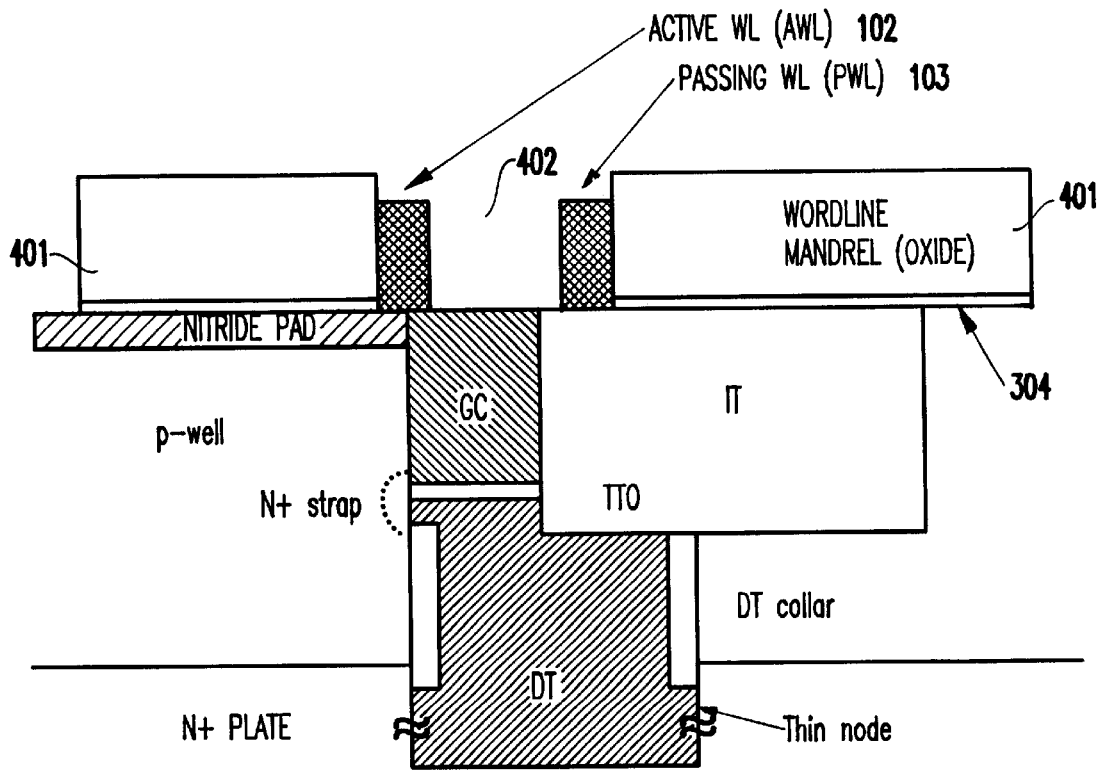
FIG. 4 illustrates a half pitch spacer wordline formation into a slot 402 formed in the structure of FIG. 3.

Referring to FIG. 4, a relatively thick (e.g., 50–200 mn) mandrel layer (preferably SiO$_2$) 401 is deposited by CVD over the top surface of the nitride layer 304. The "mandrel" 401 will serve as a structure on which the wordlines 102, 103 will be formed.

Slots 402 are patterned and etched in the oxide mandrel layer 401. The slots 402 are formed by lithographic masking and anisotropic etching (RIE) of the oxide mandrel 401 selective to the nitride etch stop layer, thereby not having to worry about an overetch. Once the nitride etch stop layer 304 is exposed, it is removed by a relatively short timed etch (e.g., wet or dry/isotropic or anisotropic) until the underlying GC polysilicon surface is exposed. Thus, vertical sidewalls are formed in these slots 402. Slots 402 will contain the spacer wordlines 102, 103.

Then, a conformal layer of wordline conductor material is deposited and anisotropically etched to form conductive spacers 102, 103. The wordline conductors 102, 103 may be formed of polysilicon, tungsten, tungsten silicide, or another suitably low resistivity material.

Alternatively, a composite structure can be formed in which a conformal layer of polysilicon may be deposited, followed by the deposition of a metal such as tungsten, titanium or cobalt. The polysilicon/metal layers are then reacted at elevated temperature to form a silicide. Then, the silicide is anisotropically etched to form conductive wordline spacers 102, 103. The composite structure will be much more conductive than polysilicon alone.

Figure 7:
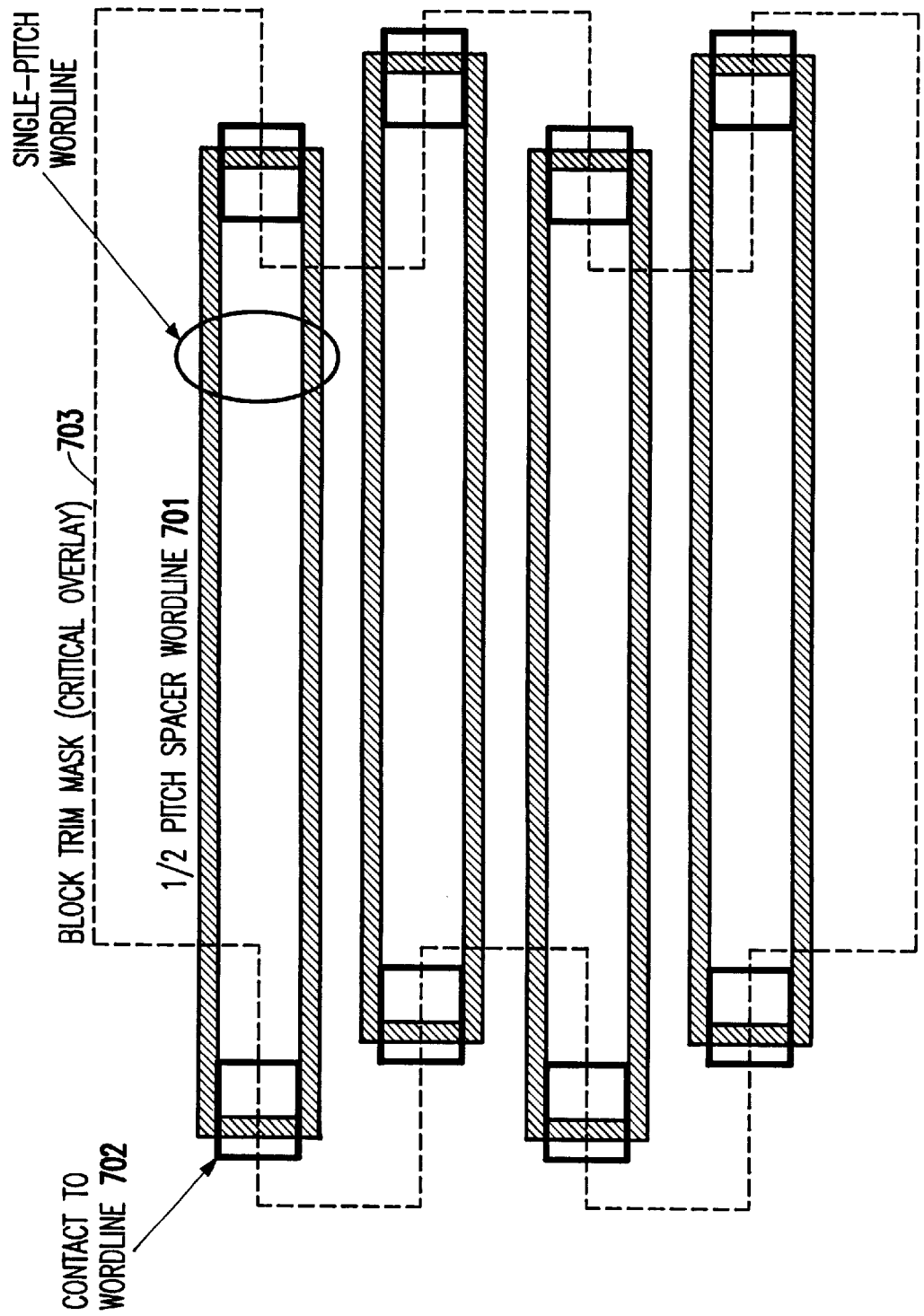
FIG. 7 illustrates a top view of a half-pitch conductor contact scheme formed in the structure of FIG. 6.

Thus, the wordline spacers 102, 103 are formed, as shown in FIG. 4. A top view of the conductive wordline spacers 102, 103 on the sidewalls of the mandrel 401 is shown in FIG. 7. The mandrels 401 appear like islands of oxide, and a spacer is formed around the entire perimeter of the mandrel 401. Hence, adjacent conductors must be separated where they are connected via the spacer formed on the short sides of the mandrel 401.

For the separation of the adjacent spacer conductors, a trim mask is used to cut the ends of the spacer material, so that each wordline is electrically separated from the others (e.g., running substantially parallel to one another). The trim mask and the process of forming the trim mask is disclosed in U.S. patent application Ser. No. 09/619,664, to Clevenger et al., concurrently filed herewith and having IBM Docket No. YO999-515, incorporated herein by reference.

Briefly, the method of separating the wordlines includes depositing a layer of photoresist, patterning the photoresist with the trim mask, such that the shorts at the ends of each wordline conductor loop are exposed. Then, the exposed portion of the conductive wordline spacers 102, 103 is etched, and the photoresist is stripped.

Figure 5:
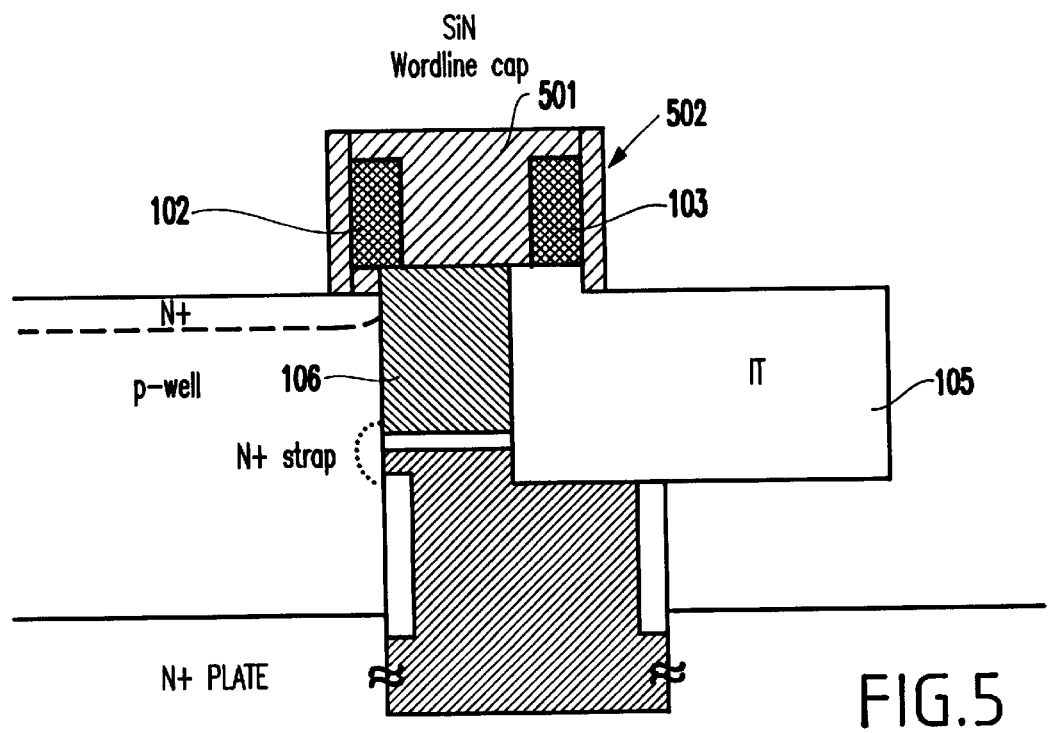
FIG. 5 illustrates a wordline cap deposition/planarization and anisotropic mandrel/pad strip formed in the structure of FIG. 4.

Referring to FIG. 5, a very thick layer of CVD SiN 501 is deposited such that it fills the entire space between conductive wordline spacers 102, 103.

The deposited SiN 501 is polished such that it is removed to the top surface of the oxide mandrel 401, thereby exposing the oxide mandrel 401. The top surface of the SiN 501 and the oxide mandrel 401 are now substantially coplanar. Thus, an insulating SiN cap 501 is formed over the wordline conductors 102, 103.

The oxide mandrel 401 is stripped using an etchant which is selective to SiN 501 such as an HF containing solution. Then, a conformal layer of SiN is deposited and anisotropically etched to form nitride spacers 502 on the sidewalls of the conductive wordline spacers 102, 103. This anisotropic etch also clears the remaining nitride and oxide from the Si surface, which allows bitline contacts to be formed in subsequent steps. Thus, pairs of the wordline conductors 102, 103 are embedded into silicon nitride (e.g., by 501 and 502). As shown, every other wordline conductor (e.g., AWL 102) in that pair are contacted to the gate conductor 106 of the transistor.

Figure 6:
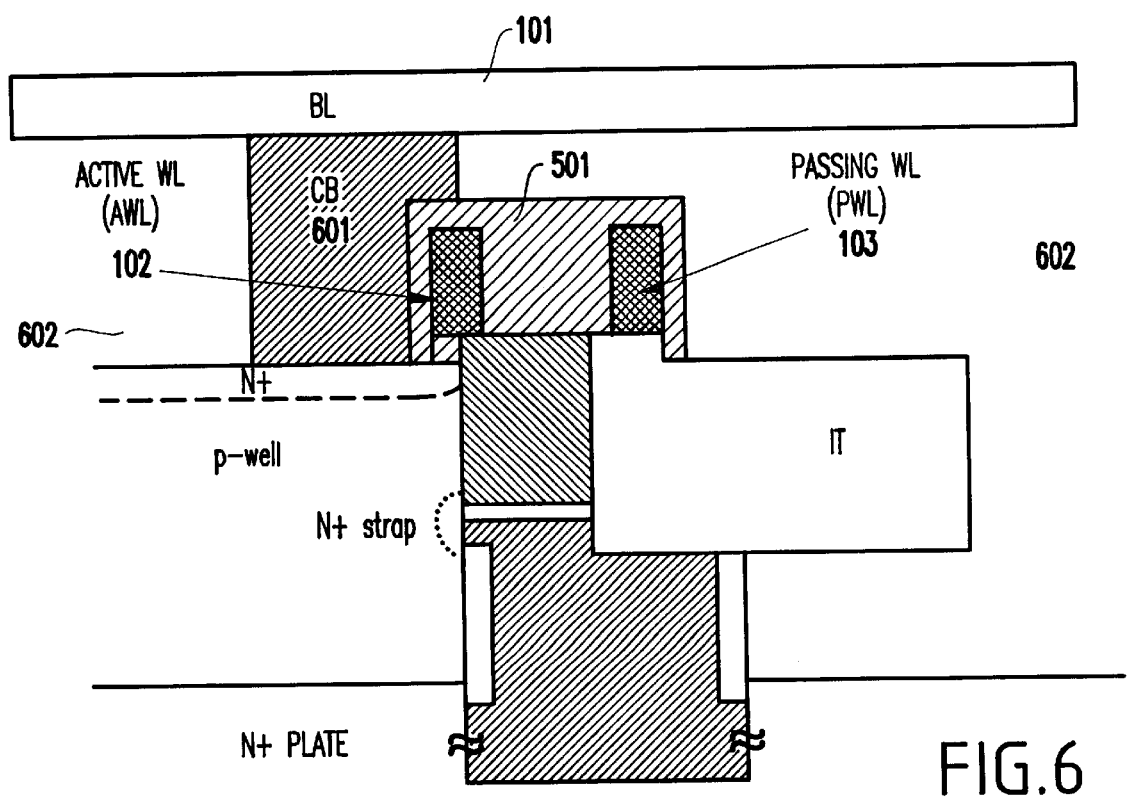
FIG. 6 illustrates a diffusion contact (CB) 601 and bitline 101 formation step for the structure of FIG. 5.

In FIG. 6, the structure of the cell after the formation of the bitline contact stud (CB) 601 and the bitline 101 metal wiring level is shown. To obtain the structure in FIG. 6, the inventive process continues by depositing a thin layer of SiN (not shown) to serve as an etch stop during the subsequent patterning and etching of the CB vias 601.

A relatively thick layer of CVD oxide 602 is deposited and planarized (CMP) such that its top surface lies above the top surface of the nitride 501 capping the wordlines 102, 103. Then, using well known methods, vias 601 are anisotropically etched into the planarized oxide layer selective to SiN.

The RIE continues until the SiN etch stop is reached, at which point the etch stops due to etch selectivity. The exposed portion of the thin nitride etch stop layer is etched out selective to oxide and silicon. A doped CB (Contact to Bitline) 601 is deposited and planarized.

Then, a bitline (BL) metal wiring 101 is deposited and patterned, as is well known in the art. The reader is directed to the discussion above with regard to the formation of the wordline conductors 102, 103 in FIG. 4 for a discussion of the wordline loop trim process shown in FIG. 7.

FIG. 7 illustrates top view of a half-pitch conductor contact scheme showing how the contacts and the trim mask are laid out. That is, the shaded rectangles 701 are the spacers 102, 103 formed around the mandrels 401. The "heavy" (bold) boxes 702 at the ends of the rectangles are the contacts to the wordlines 102, 103. The trim mask (e.g., where the cutting is to be performed) 703 is indicated by the dotted line. Thus, adjacent conductors are separated, but yet the invention provides a contact landing area for contacting each wordline.

Hence, the density can be increased with the present invention such that the cell shown has an area of 5 square minimum features or 5F×5F (e.g., a $5F^2$ cell or termed herein as "a sub-$6F^2$" cell). As mentioned above, the conventional systems using folded bitline architecture have been only able to achieve an $8F^2$ cell density. Thus, the invention can achieve a much higher density (e.g.,.on the order of 25% more), and thus the number of chip per wafer will be much higher.

Second Embodiment

Hereinbelow, referring to FIGS. 8–18, a second embodiment of the invention for improving an overlay margin between a spacer WL and a polysilicon gate conductor, will be described.

As will be clear from the description below, the second embodiment of the inventive method for forming a half-pitch spacer wordline cell with vertical access transistors improves the contact between the wordline conductor and the gate conductor for situations in which these two levels are severely misaligned. As with the first embodiment, folded bitlines are realized.

Another advantage of the method of the second embodiment is that oxide spacers and an oxide cap can be advantageously utilized to insulate the wordline conductors.

That is, as clear from the above, a nitride cap and spacers are used in the first embodiment, whereas an oxide cap and spacers are used in the second embodiment. As used in the second embodiment, oxide has the advantage of having a lower dielectric constant than nitride (e.g., 3.9 versus 7.0), thereby significantly reducing the bitline capacitance and improving the signal margin.

Figure 8:
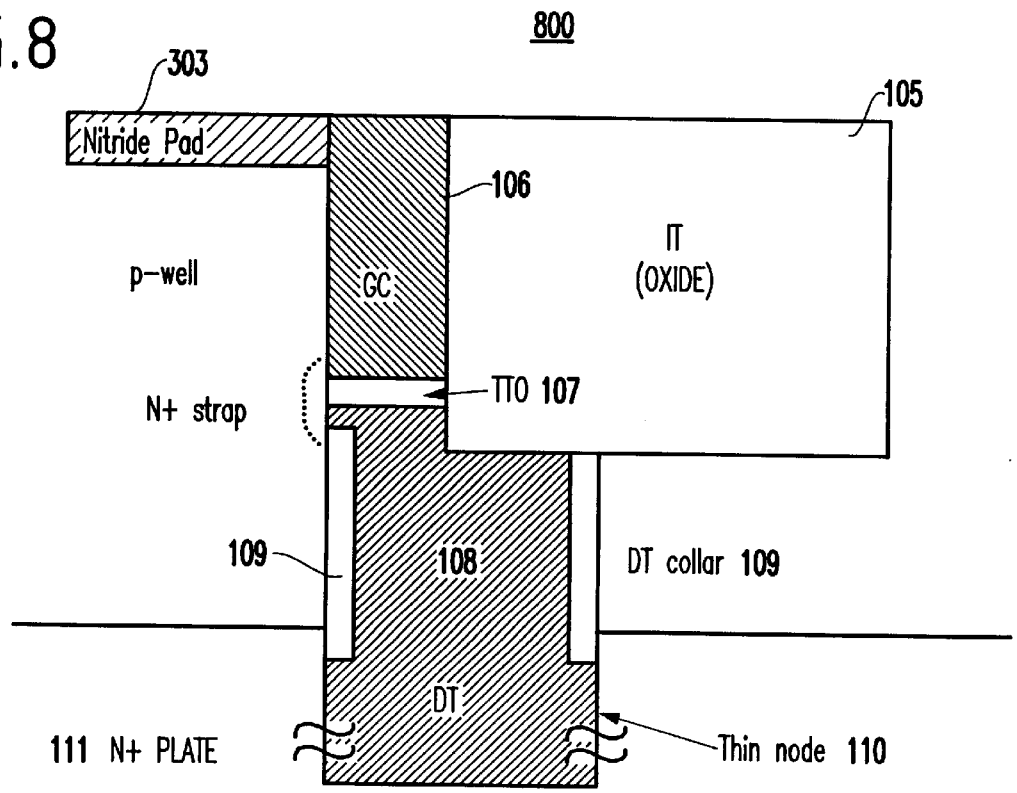
FIG. 8 illustrates a beginning step of a second preferred embodiment of the method and structure of the invention in which a conventional DRAM trench capacitor, buried strap, and isolation trench (IT) are provided, with the isolation trench having been planarized.

Turning to FIG. 8 which shows a first step of the method of the second embodiment and comparing it with FIG. 3, processing through formation of an isolation trench is substantially identical to the first embodiment, with the exception of not depositing the nitride etch stop layer 304 of FIG. 3.

That is, the process of the structure of FIG. 8 includes forming pad layers on a standard P-type monocrystalline silicon substrate, anisotropically etching (e.g., RIE) deep trenches for forming storage capacitors, and forming the capacitors within each deep trench. An N+plate 111 is formed, followed by formation of a node dielectric 110, an isolation collar 109, and an N+polysilicon conductor 108, as shown in FIG. 8.

Then, a TTO (trench top oxide) 107 is formed over the storage node N+polysilicon conductor 108, and a gate oxide is formed on the trench sidewall above the TTO 107.

Thereafter, deposition and polishing of the gate conductor polysilicon (GC) 106 is performed such that it is substantially flush with the top surface of the nitride pad layer 303. Then, a masking pattern is formed and the isolation trenches (IT) 105 are etched.

The isolation trenches 105 are filled with a CVD oxide (i.e. TEOS or HDP oxide) and the CVD oxide is planarized to the top surface of the nitride pad layer.

As mentioned above, the above steps and structure of FIG. 8 are substantially similar to those of the first embodiment shown in FIG. 3 with the exception that there is no nitride etch stop layer being deposited in FIG. 8.

Figure 9:
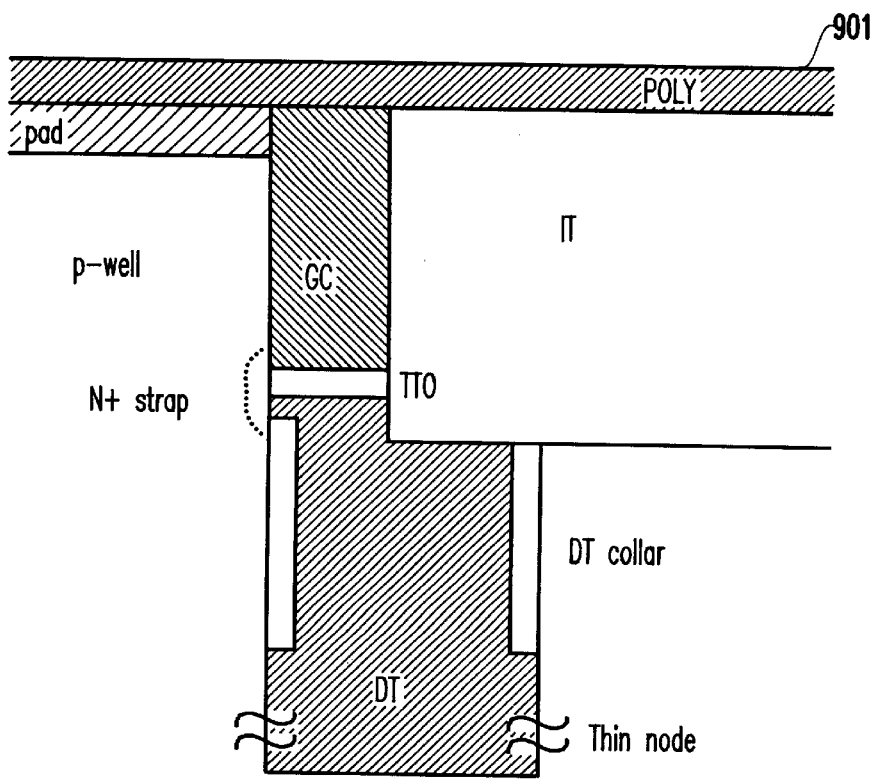
FIG. 9 illustrates deposition of a polysilicon layer 901 on the planarized surface of the structure of FIG. 8.

In FIG. 9, a layer of polysilicon 901 is deposited on the top, substantially planar surface of the pad, gate conductor and isolation trench.

Figure 10:
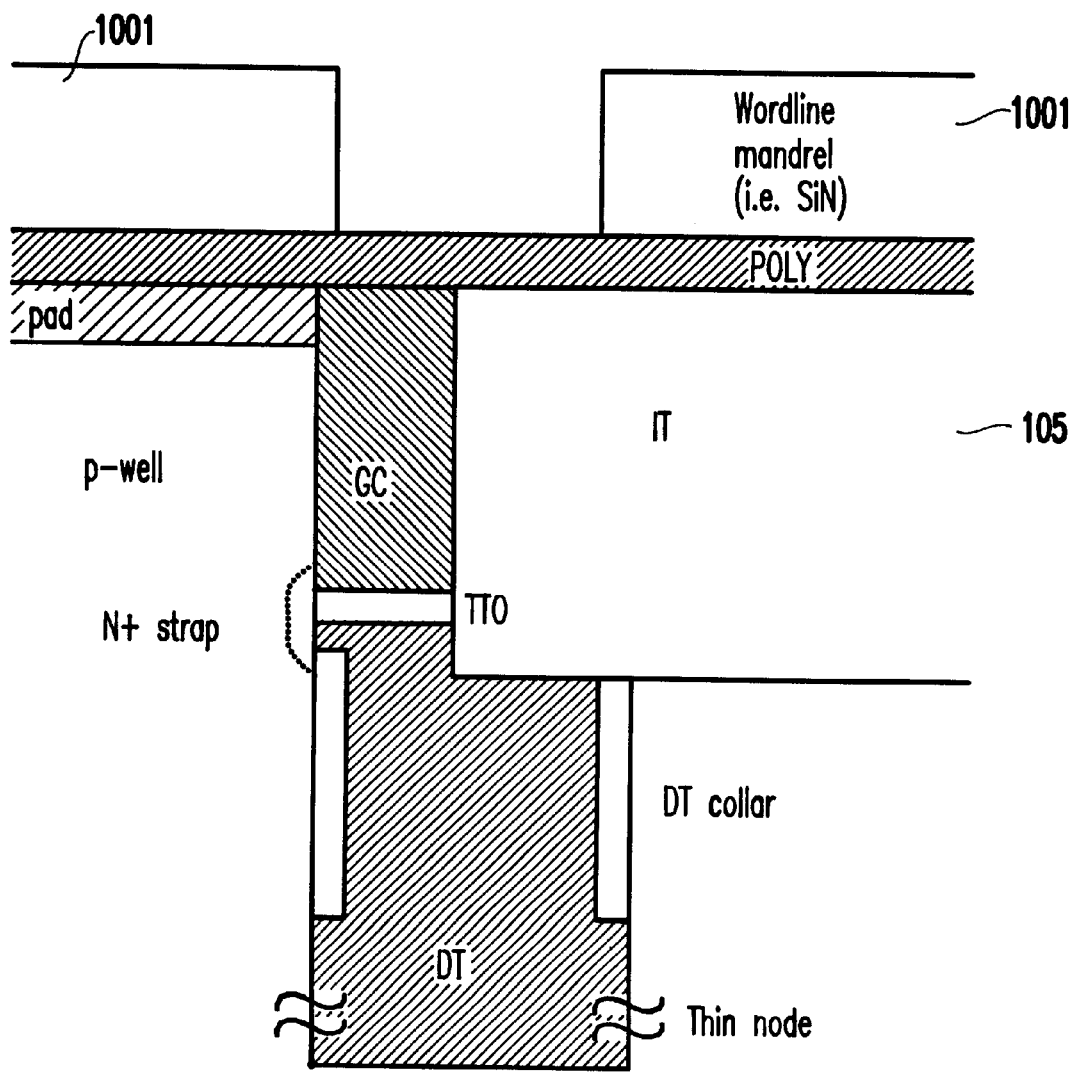
FIG. 10 illustrates formation of a wordline (WL) mandrel 1001 (e.g., SiN) on the polysilicon layer of FIG. 9.

Then, as shown in FIG. 10, a silicon nitride layer 1001 is deposited. That is, instead of an oxide layer being used for the mandrel, a nitride layer is used. Such a nitride layer is advantageous over the oxide of the first embodiment because later it will allow the use of oxide to encapsulate the spacer wordline conductors, and, as mentioned above, the oxide has a lower dielectric constant than nitride which will provide reduced bit line and wordline capacitance.

Thus, SiN mandrels are formed by first depositing a relatively thick (50–200 nm) mandrel layer (e.g., nitride and more preferably SiN) by CVD over the top surface.

Then, lithographic patterning and etching slots in the nitride mandrel layer 1001 are performed. The slots are formed by anisotropic etching (RIE) of the nitride mandrel selective to polysilicon. Thus, the etching stops once the polysilicon layer is exposed. These slots will contain the spacer wordlines and will have a pattern of mandrel-spacer-mandrel-spacer on a 2F pitch as before.

Figure 11:
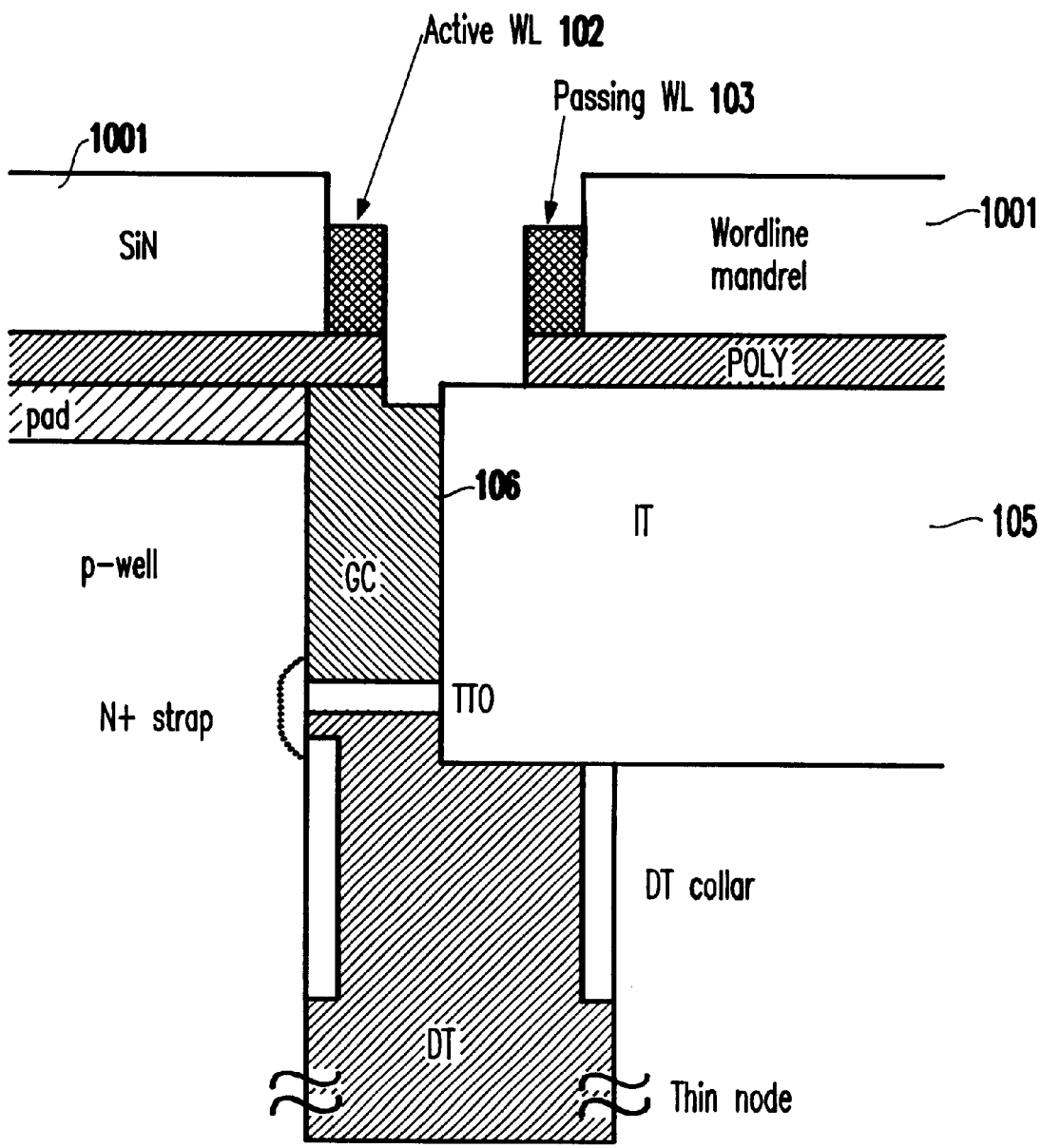
FIG. 11 illustrates deposition of a wordline conductor 102, 103 and a reactive ion over-etch of the structure shown in FIG. 10.

Referring to FIG. 11, conductive wordline spacers 102, 103 are formed on the sidewalls of the mandrel 1001. This operation is also used to cut the polysilicon layer, to avoid wordline-to-wordline shorts. The process includes depositing and anisotropically etching a conformal layer of wordline conductor material to form conductive spacers. The anisotropic etching continues through the polysilicon layer until the isolation trench oxide (IT) is exposed. The wordline conductor may be formed of polysilicon, tungsten, tungsten silicide, or a suitable low resistivity material.

Alternatively, a conformal layer of polysilicon may be deposited followed by the deposition of a metal such as tungsten, titanium or cobalt. The polysilicon/metal layers are then reacted at elevated temperature to form a silicide.

Then, the silicide is anisotropically etched through to the IT 105 to form conductive wordline spacers 102, 103 (similarly to those of the first embodiment). A top view of the conductive wordline spacers on the sidewalls of the mandrel is shown in FIG. 7. Once again, it is noted that a trim mask is used to cut the ends of the spacer material, so that each wordline is electrically separated from the others.

The method of separating the wordlines includes depositing a layer of photoresist, patterning the photoresist with the trim mask, such that the shorts at the ends of each wordline conductor loop is exposed, etching the exposed portion of the conductive wordline spacer, and stripping the photoresist.

As shown in FIG. 11, it is noted that there is a slight overetch to the gate conductor 106 through the polysilicon, thereby to separate the adjacent wordlines. A reason for using the polysilicon is that it provides a larger contact area between the active wordline conductor 102 and the gate conductor 106. For example, as compared to FIG. 5 of the first embodiment, misalignment may occur and thus it may be difficult for the wordline to sufficiently (if at all) overlap the gate conductor. Thus, there is an alignment-dependence in the first embodiment. In the structure of the second embodiment as shown in FIG. 11, the alignment-dependence has been eliminated since there is a larger contact area due to the presence of the polysilicon beneath the wordline conductor and above the gate conductor of the vertical channel transistor.

Figure 12:
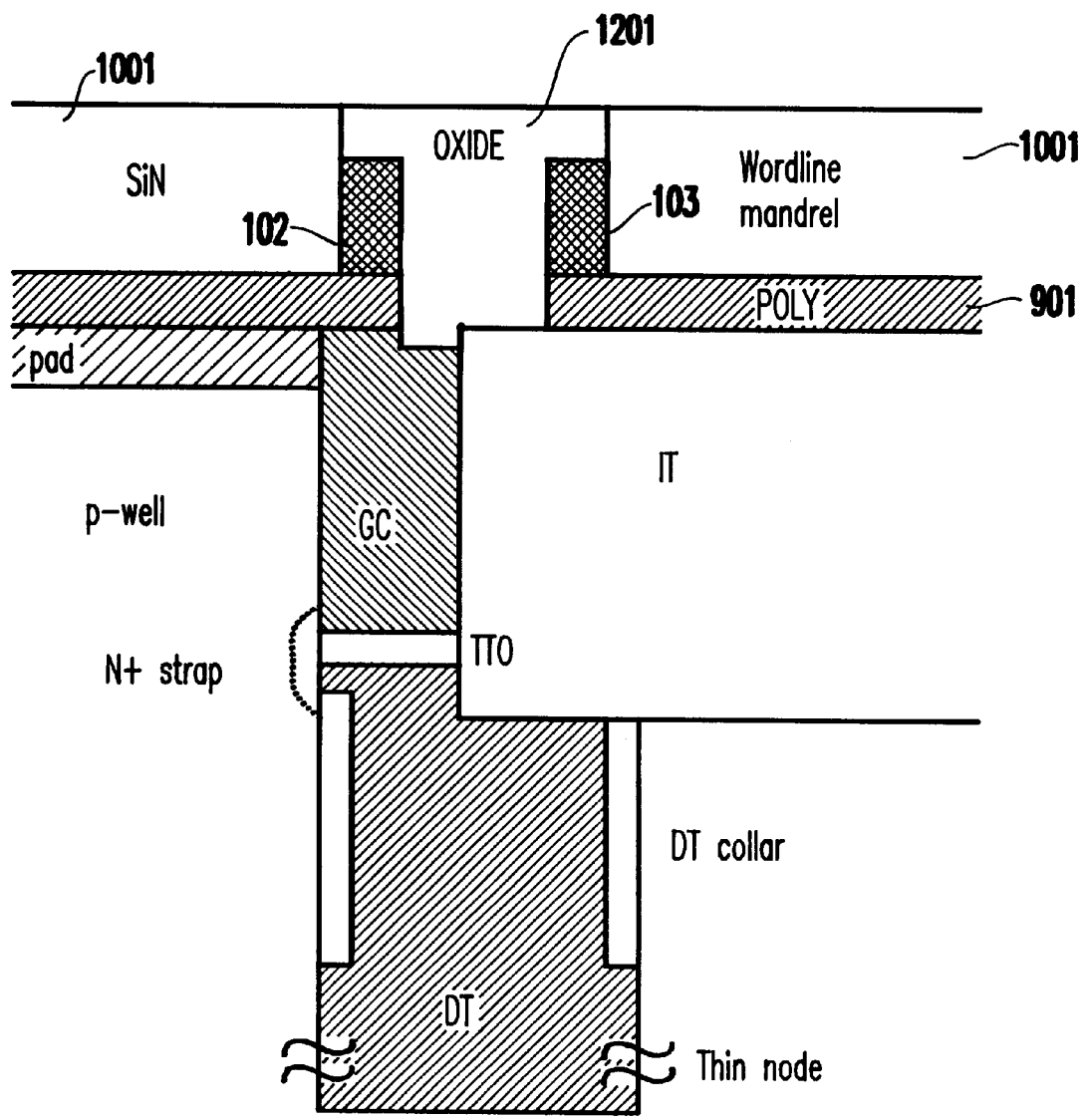
FIG. 12 illustrates chemical vapor deposition (CVD) oxide 1201 and subsequent polishing to the WL mandrel 1001 of the structure shown in FIG. 11.

Turning now to FIG. 12, the analog of the first embodiment is shown. That is, instead of filling the recess between the wordlines with nitride, a layer of CVD oxide 1201 is deposited such that the space between spacer wordlines 102, 103 is completely filled. The CVD oxide layer 1201 is polished (planarized) to the top surface of the wordline mandrel SiN 1001.

Figure 13:
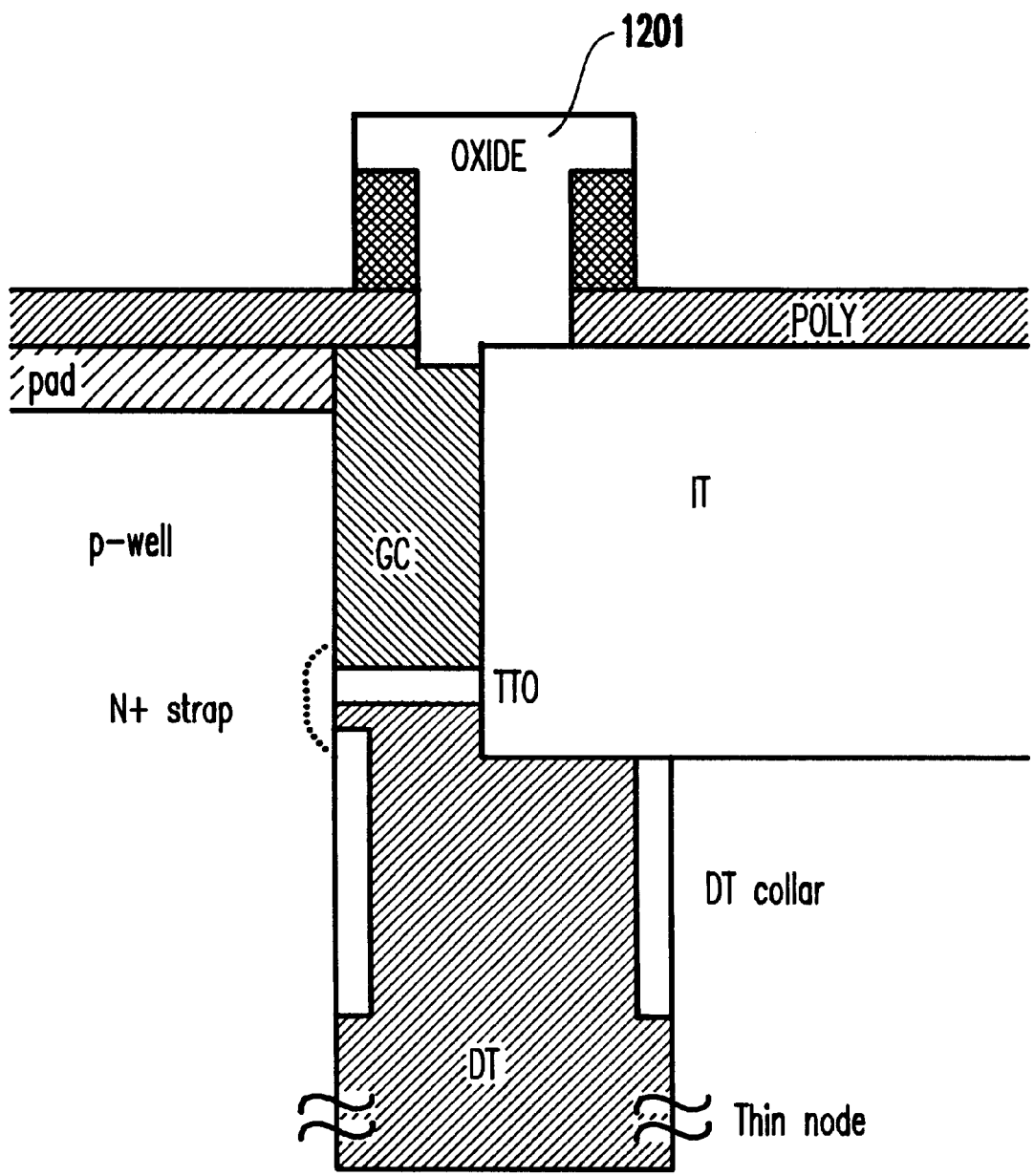
FIG. 13 illustrates removing the SiN mandrel selective to oxide and polysilicon in the structure formed in the structure of FIG. 12.

Referring to FIG. 13, the SiN mandrel 1001 is stripped with a nitride etch which is selective to oxide and polysilicon (hot phosphoric acid), such that the exterior surfaces of the wordlines 102, 103 are exposed.

Figure 14:
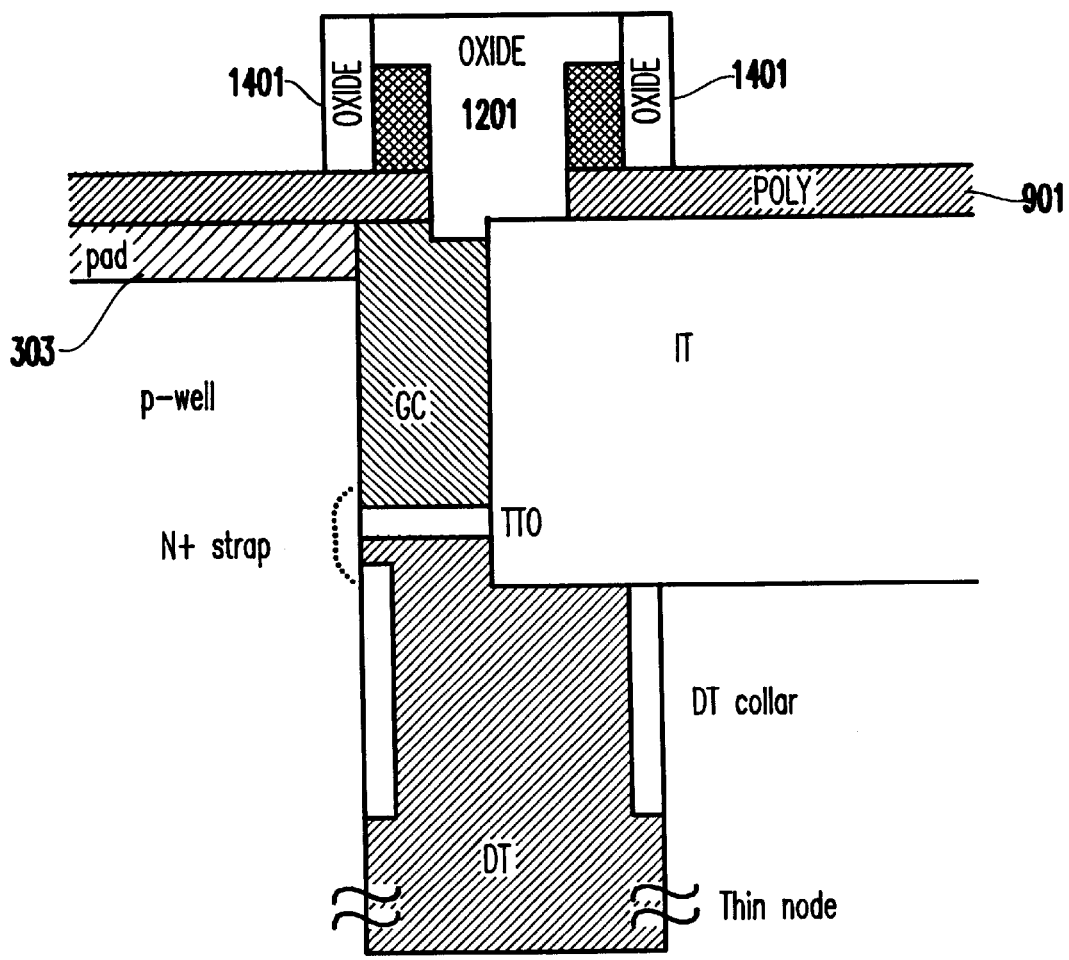
FIG. 14 illustrates formation of oxide spacers 1401 on the sidewalls of the wordlines of the structure of FIG. 13.

As shown in FIG. 14, oxide spacers 1401 are formed on the exposed (exterior) sidewalls of the spacer wordlines 102, 103. That is, a conformal layer of CVD oxide is deposited, and then the deposited layer of oxide is anisotropically etched (by RIE) selective to polysilicon to form spacers 1401.

Figure 15:
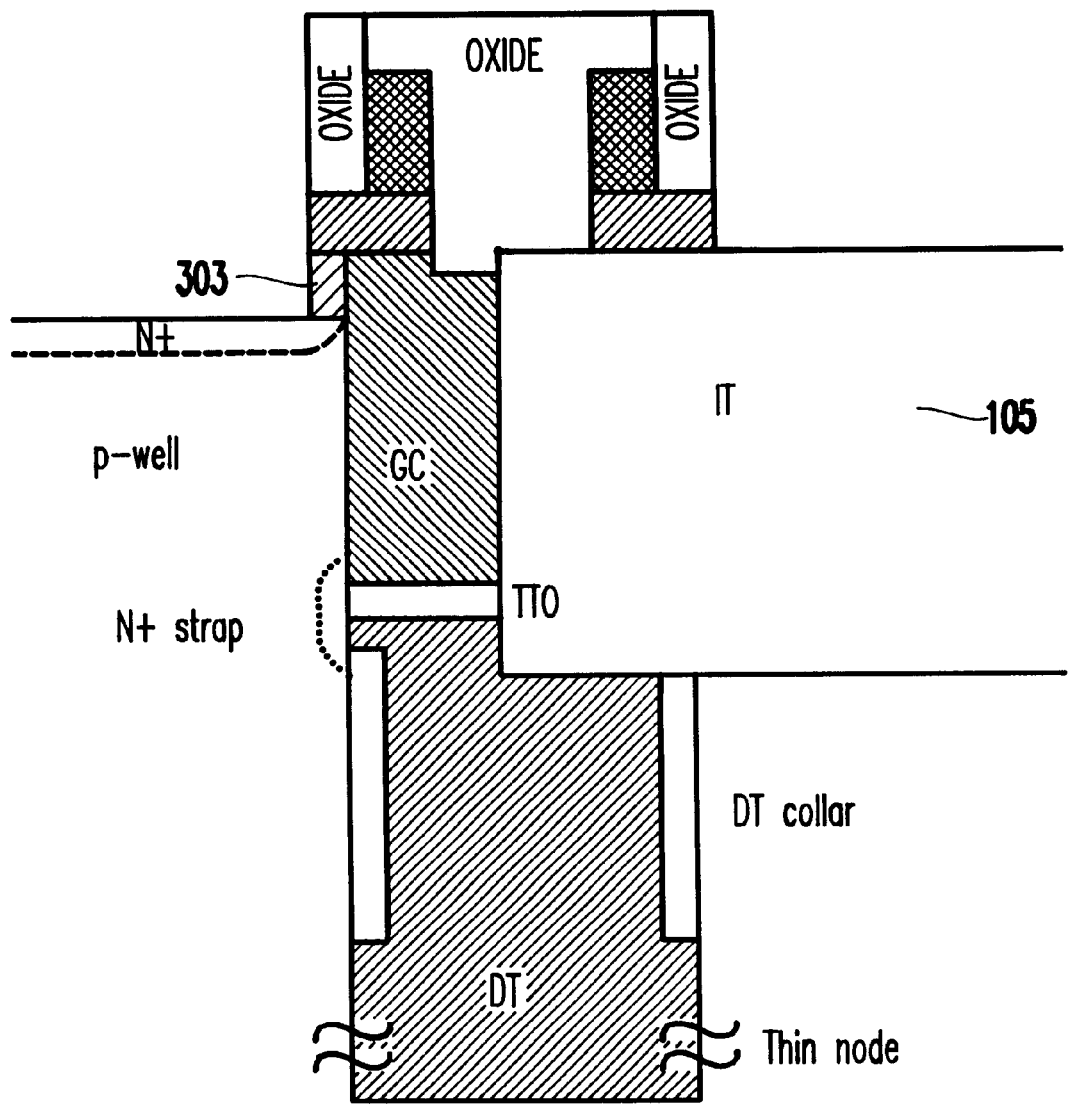
FIG. 15 illustrates a reactive ion etch (RIE) of the polysilicon and pad selective to the oxide spacers formed in the structure of FIG. 14.

Referring to FIG. 15, using the oxide as a mask, the exposed polysilicon is anisotropically (directionally) etched selective to oxide and nitride until the surface of the IT oxide 105 is reached.

Then, the exposed nitride pad layer 303 is anisotropically etched selective to oxide and silicon until the surface of the monocrystalline silicon substrate (P-well) is reached.

Figure 16:
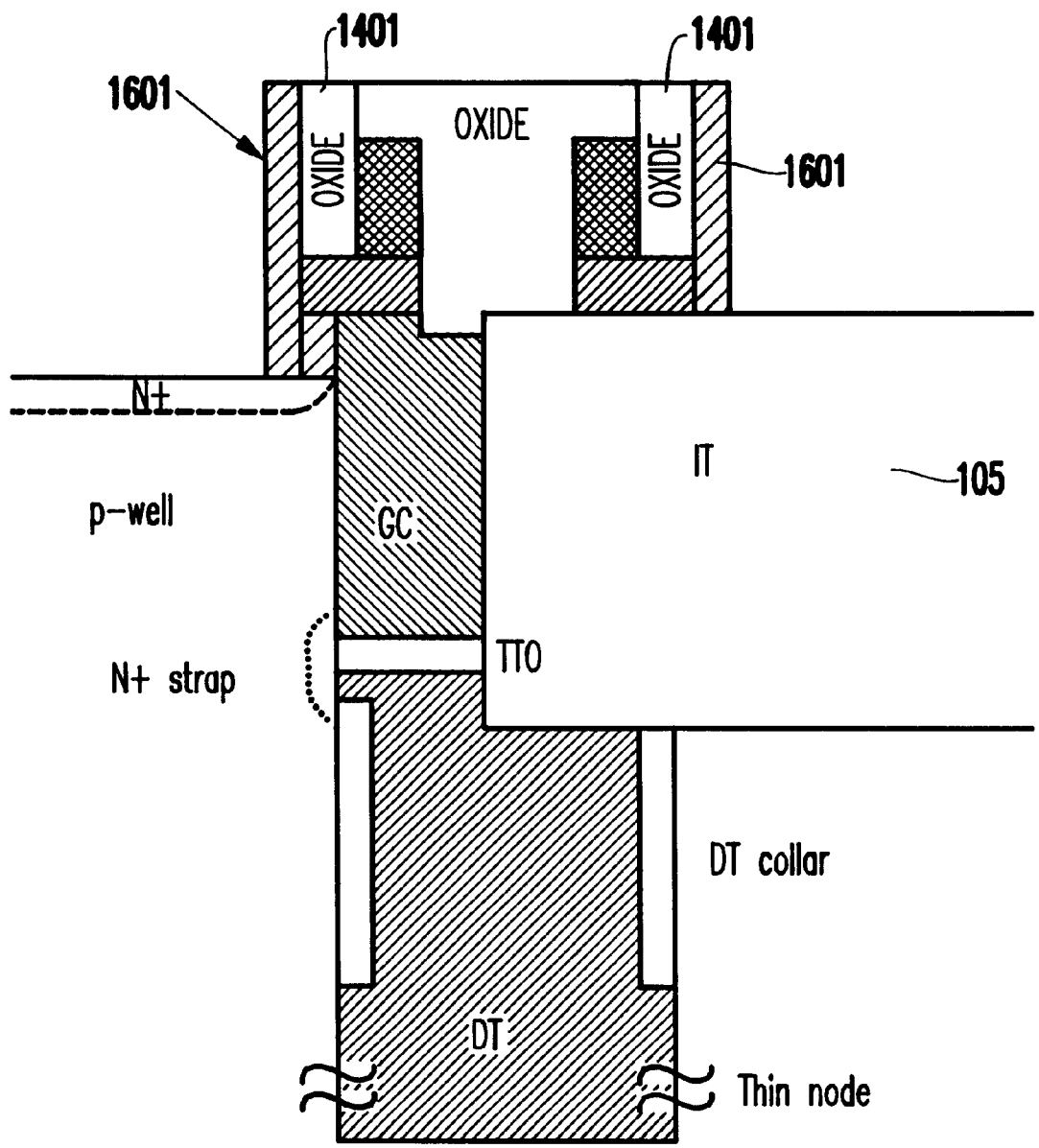
FIG. 16 illustrates formation of SiN spacers 1601 for a borderless bitline (BL) contact in the structure of FIG. 15.

As shown in FIG. 16, nitride (e.g., SiN) spacers 1601 are formed on the sidewalls of the oxide spacers 1401 and on the exposed sidewalls of the remaining portions of the polysilicon and SiN pad layers. That is, a layer of CVD nitride is conformally deposited. Then, the layer of nitride is anisotropically etched to form the spacers 1601.

Figure 17:
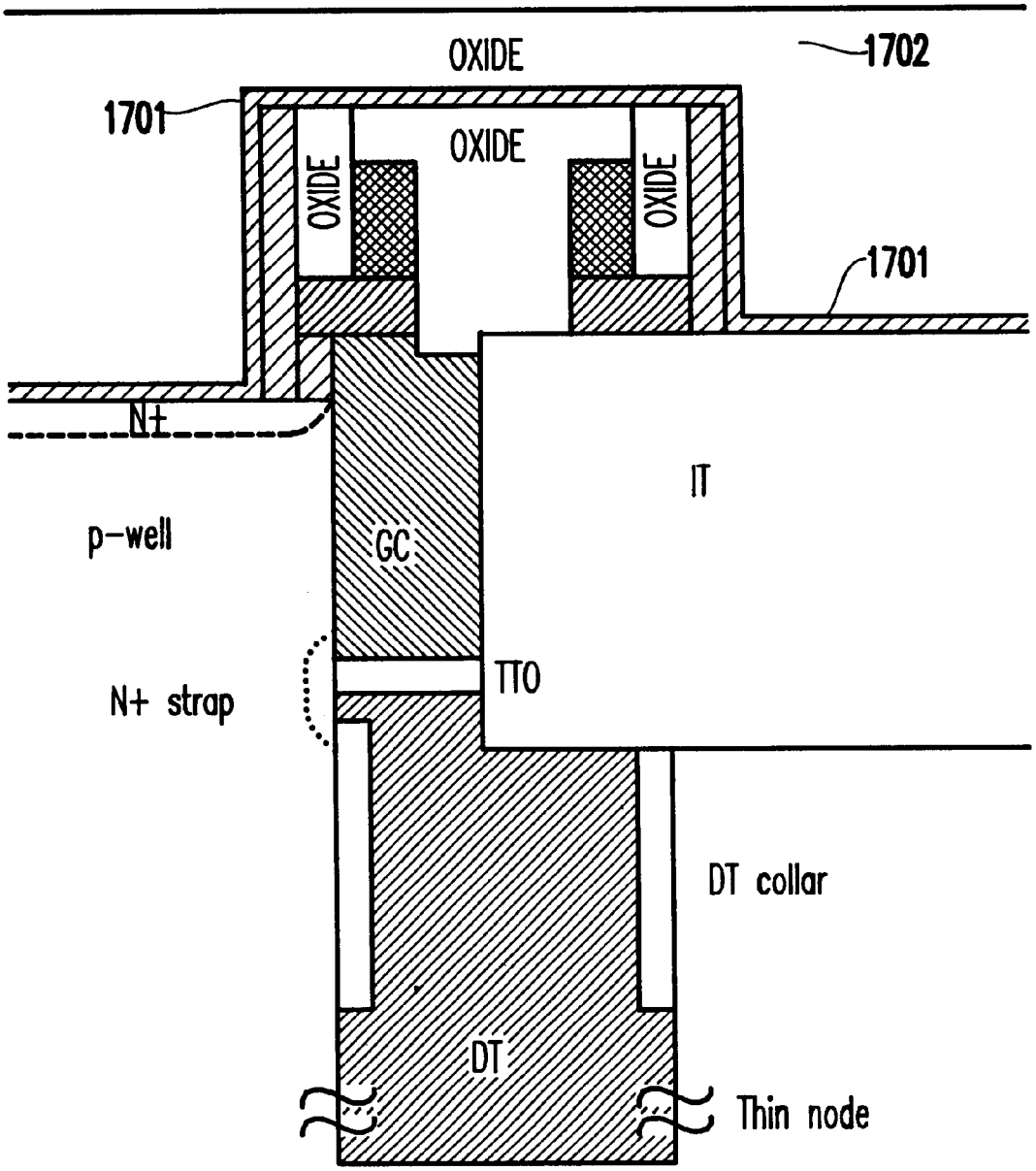
FIG. 17 illustrates formation of a SiN etch stop layer and filling the same with oxide in the structure of FIG. 16.

In FIG. 17, a conformal layer of silicon nitride 1701 is deposited. This layer 1701 serves as an etch stop during the subsequent formation of bitline contacts. Then, an oxide 1702 is deposited, as shown, which will form the contact to bitline (CB) 104 (similar to the first embodiment).

Figure 18:
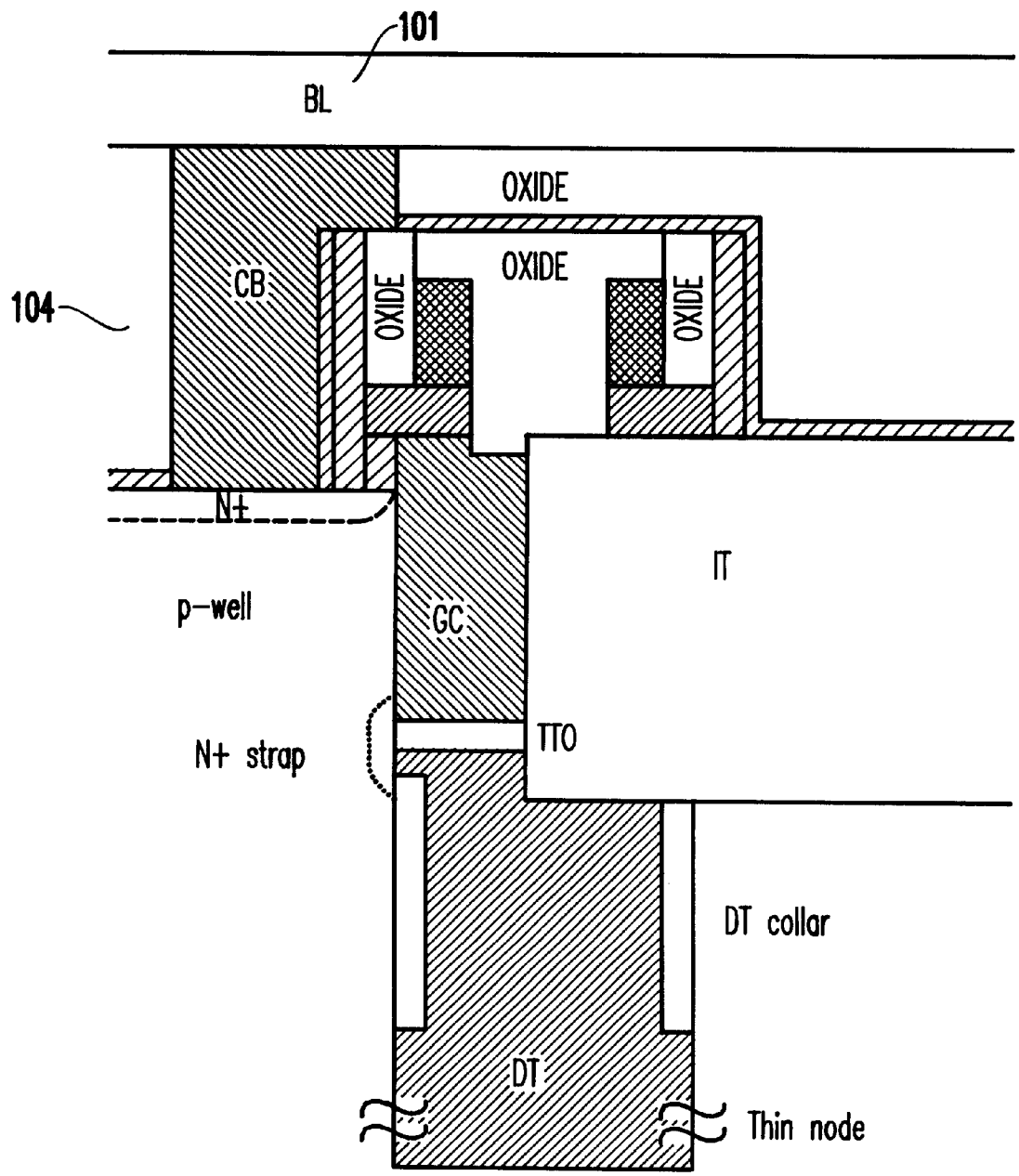
FIG. 18 illustrates a completed structure according to the second preferred embodiment of the present invention.

FIG. 18 shows the structure of the cell after the formation of the bitline contact stud (CB) 104 and the bitline (BL) metal wiring level 101. To obtain the structure in FIG. 18, as mentioned above, the thick layer of CVD oxide 1702 (as deposited in FIG. 17) is planarized (e.g., by chemical-mechanical polishing (CMP)) such that its top surface lies above the top surface of the nitride capping the wordlines 102, 103.

Then, using well known methods, in FIG. 18 vias are anisotropically etched into the planarized oxide layer selective to SiN. The RIE continues until the SiN etch stop is reached, at which point the etch stops due to etch selectivity.

The exposed portion of the thin nitride etch stop layer is etched out selective to oxide and silicon. Then, doped CB (Contact to Bitline) 104 is deposited and planarized. Finally, bitline (BL) metal wiring 101 is deposited and patterned, as is well known in the art.

Thus, the second embodiment is produced. As mentioned above, the second embodiment shares all of the advantages of the first embodiment mentioned above.

Additionally, the second embodiment of the process embodiment for forming a half-pitch spacer wordline cell with vertical access transistors improves the contact between the wordline conductor and the gate conductor for situations in which these two levels are severely misaligned. That is, the polysilicon buffer layer increases the contact area. Additionally, one edge of the polysilicon buffer layer is self-aligned or substantially collinear (coplanar) with the word line conductor because the word line conductor had been used as a mask to etch through the polysilicon layer. Thus, by definition, these layers are substantially collinear.

Further, as with the first embodiment, folded bitlines are realized.

Another advantage of the method of the second embodiment is that oxide spacers and an oxide cap can be advantageously utilized to insulate the wordline conductors. As mentioned above, oxide has a lower dielectric constant than nitride, and hence lower capacitance of the wordline and better performance are achieved with the oxide.

Hence, with the unique and unobvious aspects of the invention, a half-pitch wordline is provided which achieves locally-folded sensing, and common-mode rejection of noise components introduced on the scale of adjacent cells, and on the scale of the array. Additionally, a half-pitch wordline eliminates the need for an additional bitline wiring level and provides a cell with much higher density than the conventional structures. Further, with the invention, a vertical array cell access transistor channel length may be scaled independently of the lithographic ground rule.

While the invention has been described in terms of preferred embodiments, those skilled in the art will recognize that the invention can be practiced with modification within the spirit and scope of the appended claims.

For example, the trench capacitor as described above may be formed using other structures and methods which may include sequential deposition, recesses, and sidewall spacer formations. Additionally, the trench-sidewall vertical device transistor and buried strap may be formed using a variety of process sequences and techniques which will not alter the function of the spacer-wordline folded-bitline memory cell element as described in the present application.

What is claimed is:

1. A method of forming a semiconductor device, comprising:
    forming a mandrel;
    forming spacer wordline conductors on sidewalls and around a perimeter of said mandrel;
    separating, by using a trim mask, adjacent spacer wordline conductors; and providing a contact area to contact alternating ones of pairs of said spacer wordline conductors.

2. The method of claim 1, wherein a pitch of said mandrel and spacer wordline conductor pattern is 2F representing two minimum feature sizes.

3. The method of claim 2, wherein a pitch of adjacent spacer wordline conductors is 1F representing one minimum feature size.

4. The method of claim 1, wherein a pitch of adjacent spacer wordline conductors is 1F representing one minimum feature size.

5. The method of claim 1, further comprising:
    forming said semiconductor device on a silicon substrate, wherein said spacer wordline conductors are formed above a surface of said silicon substrate.

6. The method of claim 5, further comprising:
    forming a gate conductor of a vertical channel transistor above said silicon substrate.

7. The method of claim 5, wherein alternate ones of said spacer wordline conductors contact a gate conductor of a vertical transistor.

8. The method of claim 7, wherein said alternate ones of said spacer wordline conductors directly contact said gate conductor.

9. The method of claim 7, further comprising:
    forming a polysilicon layer, said spacer wordline conductors being formed on said polysilicon layer and contacting said gate conductor through said polysilicon layer.

10. The method of claim 1, further comprising:
    forming a polysilicon layer, said spacer wordline conductors being formed on said polysilicon layer.

11. The method of claim 1, further comprising:
    encapsulating said pairs of spacer wordline conductors with a nitride.

12. The method of claim 11, further comprising:
    forming nitride spacers on sidewalls of said spacer wordline conductors.

13. The method of claim 1, further comprising:
    encapsulating said pairs of spacer wordline conductors with an oxide.

14. The method of claim 13, further comprising:
    forming nitride spacers on sidewalls of said oxide.

15. A method of forming a semiconductor device, comprising:
    forming a plurality of mandrels;
    depositing wordline conductor material;
    etching said wordline conductor material to form a perimeter of wordline conductor material around each of said mandrels; and
    separating said perimeter of wordline conductor material at two opposing sides of each of said mandrels to form two adjacent spacer wordline conductors on sidewalls of each of said mandrels.

16. The method according to claim 15, further comprising:
    contacting alternating pairs of said adjacent spacer wordline conductors.

17. The method according to claim 15, wherein said separating comprises using a trim mask.

18. The method according to claim 15 further comprising:
    depositing a mandrel layer: and
    etching said mandrel layer to form a plurality of mandrels.

* * * * *